United States Patent [19]

Gulczynski

[11] Patent Number: 4,929,848
[45] Date of Patent: May 29, 1990

[54] HIGH ACCURACY REFERENCE LADDER

[76] Inventor: Zdzislaw Gulczynski, P.O. Box 441, Winchester, Mass. 01890

[21] Appl. No.: 304,510

[22] Filed: Jan. 31, 1989

[51] Int. Cl.$^5$ .......................... H03K 3/53; G06F 1/00
[52] U.S. Cl. .................................... 307/246; 307/264; 307/296.1; 307/296.4
[58] Field of Search ..................... 307/264, 246, 296.1, 307/296.4, 296.6, 490

[56] References Cited

U.S. PATENT DOCUMENTS 4,398,099  8/1983  Benoit-Gonin et al. ............ 307/246
4,713,650  12/1987  Temes et al. ........................ 307/246

Primary Examiner—John Zazworsky

[57] ABSTRACT

The reference ladder provides a plurality of reference signals having an extremely high accuracy. The reference ladder comprises no resistors. The values of all components and on-resistances of switches are not essential. Also no matching is necessary. The reference ladder comprises capacitors coupled in series. The terminals of each ladder capacitor are successively coupled across another capacitor which stores a base voltage. A comparator compares a predetermined voltage against voltage appearing across the reference ladder and determines the base voltage.

11 Claims, 4 Drawing Sheets

HIGH ACCURACY REFERENCE LADDER

CROSS REFERENCE TO RELATED INVENTIONS

This application is related to:
"Dual Flash Analog-to-Digital Converter" Ser. No. 316,592 filed 02/24/89;
"Dual Flash Analog-to-Digital Converter" Ser. No. 316,693 filed 02/24/89;
"Dual Flash Analog-to-Digital Converter" Ser. No. 316,594 filed 02/24/89;
"High Resolution True Flash Analog-to-Digital Converter" Ser. No. 304,505 filed 01/31/89 herewith;
"Encoder and Digital memory for Flash Analog-to-Digital Converters" Ser. No. 304,506 filed 01/31/89 herewith;
"Ultra Fast High Resolution Digital-to-Analog Converter" Ser. No. 304,507 filed 01/31/89 herewith;
"High Power Switching Power Supply with High Power Factor" Ser. No. 304,508 filed 01/31/89 herewith;
"High Power Switching Power Supply Having High Power Factor" Ser. No. 304,509 filed 01/31/89 herewith;
"High Speed Integrating Analog-to-Digital Converter" Ser. No. 251,171 filed 09/30/88;
"Flash Analog-to-Digital Converter with Integrating Input Stage" Ser. No. 248,498 filed 09/22/88;
"Sample-and-Hold Amplifier with Current Source Charger" Ser. No. 201,071 filed 05/27/88;
"High Speed Integrating Digital-to-Analog Converter" Ser. No. 198,110 filed 05/23/88;
"High Speed Instrumentation Amplifier with Minimized Offset Voltage and Drift" U.S. Pat. No. 4,829,263 dated 05/09/89;
"Digital-to-Analog Converter with Digital Correction" U.S. Pat. No. 4,843,392 dated 06/27/89;
"Flash Analog-to-Digital Converter" U.S. Pat. No. 4,763,106 dated 08/09/88;
"Dual Flash Analog-to-Digital Converter" U.S. Pat. No. 4,857,931 dated 08/15/89;
"Digital-to-Analog Converter" U.S. Pat. No. 4,811,017 dated 03/07/89;
"Digital-to-Analog Converter" U.S. Pat. No. 4,837,572 dated 06/06/89;
"Operational Amplifier or Comparator Circuit with Minimized Offset Voltage and Drift" U.S. Pat. No. 4,749,953 dated 06/07/88; and
"Push-Pull Power Amplifier" U.S. Pat. No. 4,476,441 dated 10/09/84.
All inventions are by the same inventor.

BACKGROUND OF THE INVENTION

The invention relates to a reference ladder providing a plurality of reference signals having an extremely high accuracy.

Some electronic devices require a large number of high accuracy reference signals. These signals are usually obtained by means of a chain of equally valued resistors coupled between a reference voltage source and ground. If the resistor ladder is referenced to a variable signal source rather than ground, a reference current source is required For instance, conventional flash analog-to-digital converters comprise a reference voltage source, comparators connected in parallel and a chain of equally valued resistors providing reference voltages thereto. The input bias currents of comparators with bipolar input stage are very high and vary with the input signal. The bias currents are added so that different resistors of the resistor ladder conduct different currents. Comparators with FET input stage have a very poor accuracy. Autozeroing the comparators is necessary, whereby large parasitic capacitances are introduced. As a result, reference signals provided by the resistor ladder are unstable and resistor values must be small.

The resistor ladder causes deficient long term and temperature stability, reduced speed and accuracy, enlarged chip space and increased power consumption, etc. In contrast, integrated MOS capacitors are most accurate integrated circuit components. For instance, their absolute accuracy and tolerance fluctuation due to time, mechanical stress and voltage are far superior to any other component.

SUMMARY OF THE INVENTION

The invention is intended to provide a reference ladder yielding a plurality of reference signals having an extremely high accuracy. The reference ladder comprises no resistors. The values of all components and on-resistances of switches are not essential. No matching is necessary.

Reference apparatus according to the invention provides reference signals and comprises an input capacitive means for storing a base signal, a source means for charging the input capacitive means, a switch means having outputs for coupling the input capacitive means thereto or to the source means, an output capacitive means having a plurality of terminals for providing the reference signals, and a selective means for selecting at least a pair of the output capacitive means terminals and coupling the switch means outputs thereto.

In another embodiment the source means includes a reference means for providing an additional reference signal, and a comparator means for comparing the additional reference signal against a signal appearing between a pair of the output capacitive means terminals.

In yet another embodiment the source means further includes a sampling means for sampling the signal appearing between the pair of the output capacitive means terminals. The sampling means includes a second capacitive means for storing the signal appearing between the pair of the output capacitive means terminals, and a second switch means for coupling the second capacitive means to the pair of the output capacitive means terminals.

BRIEF DESCRIPTION OF THE DRAWINGS

The present invention will become more clear in conjunction with the accompanying figures throughout which similar references may denote similar parts and of which.

DETAILED DESCRIPTION OF THE INVENTION

Figure 1:
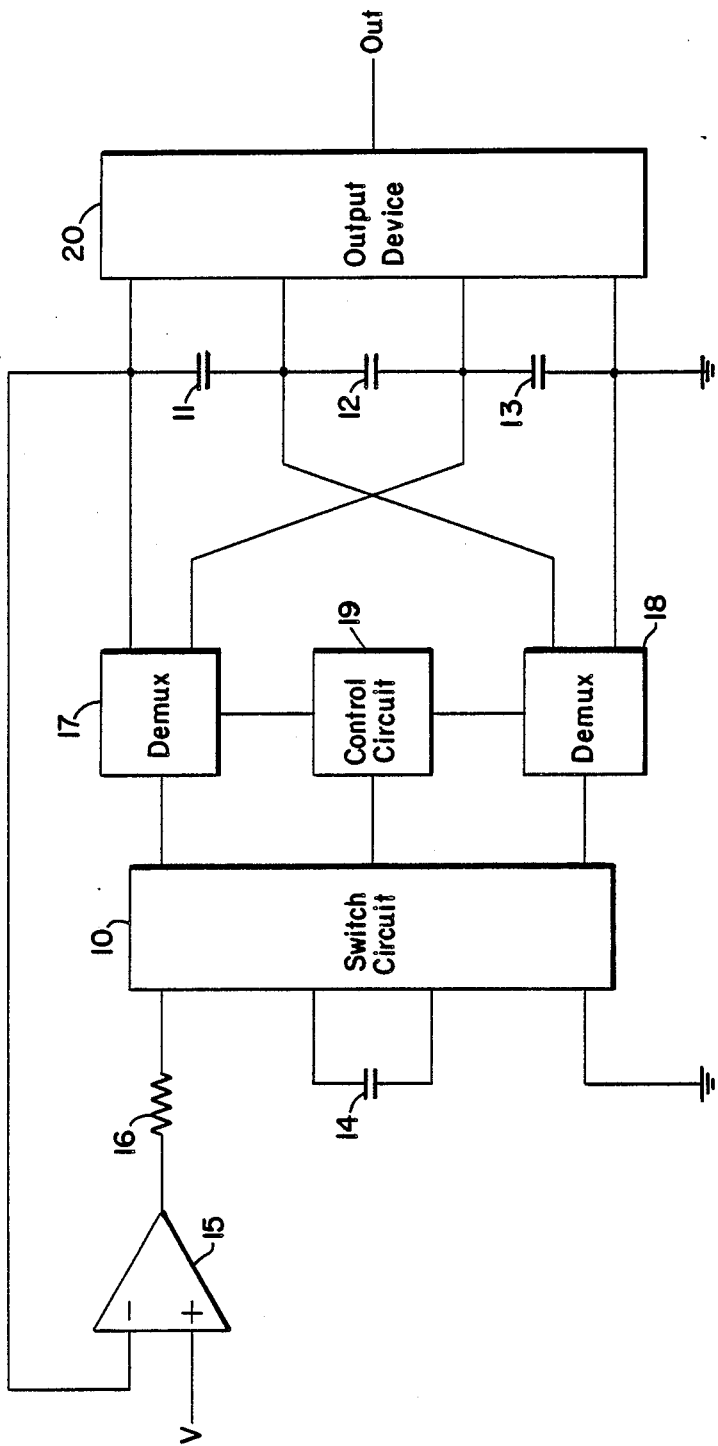
FIG. 1 is an embodiment with capacitor ladder providing high accuracy reference signals.

FIG. 1 is an embodiment with capacitor ladder providing high accuracy reference signals. The ladder comprises a plurality of capacitors each coupled to a pair of terminals for providing the reference signals. Three capacitors 11 thru 13 coupled in series are shown for simplicity. The ladder is coupled to ground. A source means charges the capacitor 14 and thereby determines a base voltage stored therein. The switch circuit 10 has a pair of outputs for alternatively coupling the capacitor 14 thereto or to the source means. A selective means selects at least a pair of the ladder terminals and couples the outputs of the switch circuit 10 thereto.

The selective means includes the demultiplexers 17 and 18 each for selecting one of the ladder terminals and coupling one of the switch circuit outputs thereto. Specifically, while the demultiplexer 17 selects one terminal of one of the capacitors 11, 12 or 13, the demultiplexer 18 selects the other terminal of the same capacitor. By these means, this capacitor and capacitor 14 are both coupled to the outputs of the switch circuit 10, thus in parallel. The capacitors 11 thru 13 are successively coupled to the outputs of the switch circuit 10.

The source means includes the comparator 15 which compares the voltage V against a voltage appearing across the capacitor ladder. Specifically, a reference voltage source provides the voltage V and is coupled to the noninverting input of the comparator 15. The inverting input thereof is coupled to the capacitor 11. The output of the comparator 15 is low or high when the voltage across the capacitor ladder is greater or smaller than V respectively. As a result, the base voltage across the capacitor 14 is adjusted to V/3 so that the sum of the voltages across the capacitors 11 thru 13 is equal V. Obviously, the capacitors 11 thru 13 are each charged to V/3. The accuracy of the reference voltages is very high since the sum of the voltages across the capacitors 11 thru 13 is determined by separately setting the voltages stored therein.

The resistor 16 is coupled in series with the output of the comparator 15 for reducing a current charging the capacitor 14. Furthermore, the rate at which the capacitor 14 is charged depends on the capacitance thereof, resistance of the resistor 16 and output voltage of the comparator 15. The capacitor 14 can be also charged after charging each of the capacitors 11 thru 13.

Generally, the comparator 15 compares the voltage V against a signal appearing between any given pair of ladder terminals, whereby availability of the reference source providing specific voltage V can be considered. The selective means can select more than one pair of the ladder terminals and more than one capacitor, such as the capacitor 14, can be used. Consequently, base voltages stored in these capacitors can be applied to more than one capacitor of the ladder simultaneously.

The control circuit 19 controls the switching of the switch circuit 10 and demultiplexers 17 and 18. The switching is independent of any operation of the output device 20 coupled to the capacitor ladder. For instance, the output device 20 may be a high speed digital-to-analog converter disclosed in the abovementioned "Digital-to-Analog Converter" U.S. Pat. No. 4,811,017 dated 03/07/89, by the same inventor.

The operation of the apparatus will become more clear by analyzing an example of the ladder providing four reference voltages equal 0V, 1V, 2V and 3V. The voltage V is equal to 3V. Initially, the switch circuit 10 couples the capacitor 14 between the resistor 16 and ground. The capacitor 14 is charged to a positive voltage. Subsequently, the switch circuit 10 couples the capacitor 14 across the inputs of the demultiplexers 17 and 18. The demultiplexer 17 selects one end of the capacitor 11 while the demultiplexer 18 selects the other end of the capacitor 11, whereby the capacitor 14 is coupled in parallel therewith. Similarly, the demultiplexers 17 and 18 select another pair of the ladder terminals, whereby the capacitor 14 successively recharges the capacitors 12 and 13.

After recharging each of the capacitors 11 thru 13, the switch circuit 10 couples the capacitor 14 between the resistor 16 and ground. The capacitor 14 is charged or discharged when the voltage across the reference ladder is lower or higher than 3V respectively. As a result, the voltage across the capacitor 14 is substantially equal 1V.

The values of the capacitors 11 thru 13 are significantly smaller than of the capacitor 14, whereby the base voltage stored therein remains virtually unchanged. The values of all components including capacitors 11 thru 14 and on-resistances of switches of the switch circuit 10 and demultiplexers 17, 18 are not essential. Also no matching is necessary.

Figure 2:
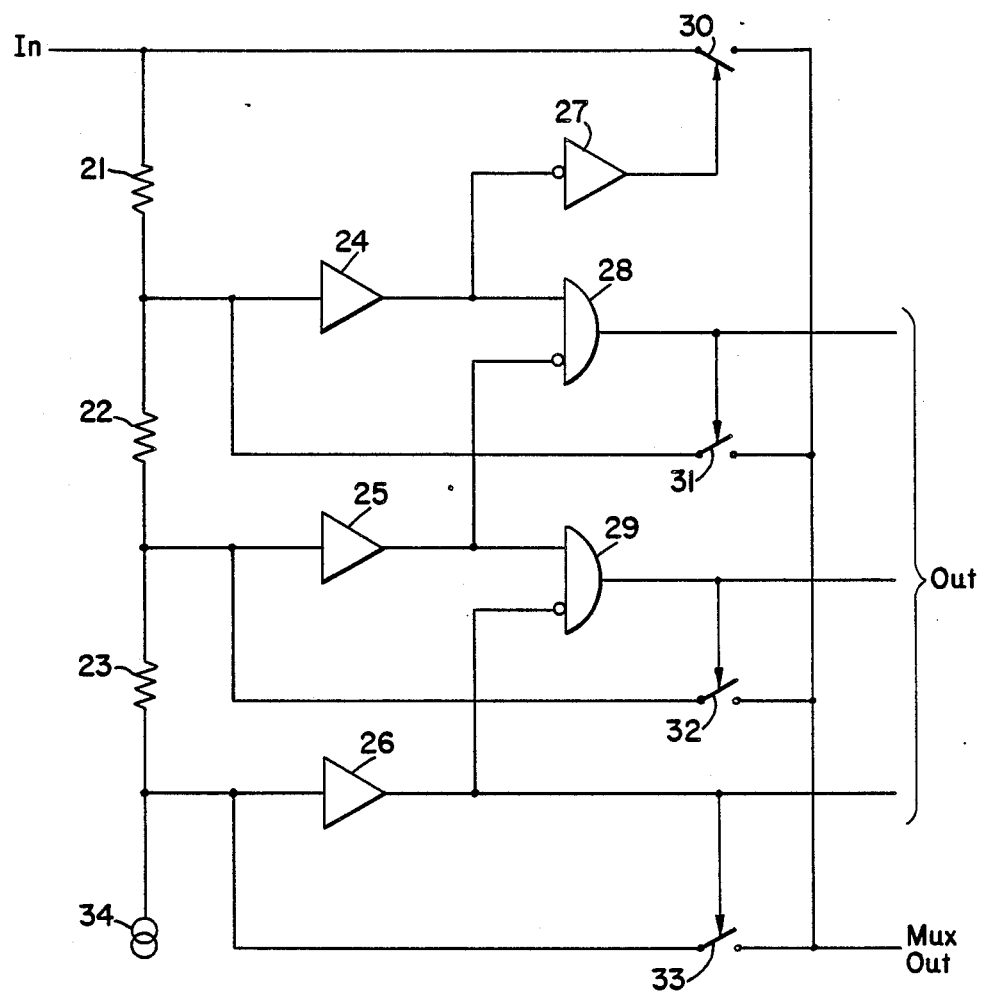
FIG. 2 is a comparator/multiplexer section of 4-bit flash analog-to-digital converter disclosed in the above-mentioned "Flash Analog-to-Digital Converter" U.S. Pat. No. 4,763,106 dated 08/09/88, by the same inventor.

FIG. 2 is a comparator/multiplexer section of 4-bit flash analog-to-digital converter disclosed in the abovementioned "Flash Analog-to-Digital Converter" U.S. Pat. No. 4,763,106 dated 08/09/88, by the same inventor. The section receives the input signal, and provides an output code and multiplexer output signal. The resistor ladder consists of a chain of equally valued resistors 21 thru 23 coupled between the input signal and reference current source 34. The ladder provides reference and comparison signals with reference to the input signal and ground respectively.

The comparators 24 thru 26 are coupled to the ladder for comparing the respective comparison signals against ground, thus establishing polarity thereof, and for determining the output code. The comparison signals are also separately applied to the switches 30 thru 33 for selecting one of the signals in response to the output code. The switches 30 thru 33 constitute a multiplexer as each switch is coupled for applying the respective comparison signal to the multiplexer output.

Only one pair of adjacent comparators, i.e. having inputs coupled to the same resistor of the ladder, outputs 1 and 0. Any comparators receiving comparison signals having higher and lower values output 1 and 0 respectively. The output code produced by the comparator/multiplexer section has a single 1 indicating the 1-0 bit break and is thus well suited for controlling the switches 30 thru 33 of the multiplexer.

For that purpose the inverter 27 and AND gates 28, 29 are used. The gates 28 and 29 have noninverting and inverting inputs coupled to outputs of the adjacent comparators 24, 25 and 25, 26 respectively. This also significantly simplifies the multiplexer structure as in place of its decoder the gates 27 thru 29 are used, further controlling the switches 30 thru 32 respectively. The output code of the comparator/multiplexer section derives from the gates 28, 29 and comparator 26. The outputs of the comparators 24 thru 26 provide a "thermometer" code which can be sampled by a conventional encoder.

The encoder disclosed in the abovementioned "Encoder and Digital Memory for Flash Analog-to-Digital Converter" Ser. No. 304,506 filed on even day herewith, by the same inventor, is recommended for a superior performance.

The operation of the comparator/multiplexer section will become more clear by analyzing an example of the ladder providing four reference voltages equal 0V, −1V, −2V and −3V, analogous to the previous numeric example. The comparators 24 thru 26 determine the output code. In response thereto only one of the switches 30 thru 33 is closed, whereby the respective comparison voltage is applied to the multiplexer output. The following table illustrates the operation of the comparator/multiplexer section. The voltage E is equal to or greater than 0V and less than 1V.

| Input voltage | Output code | Switch closed | Mux output voltage |
|---|---|---|---|
| E | 000 | 30 | E |
| 1V + E | 100 | 31 | E |
| 2V + E | 010 | 32 | E |
| 3V + E | 001 | 33 | E |

By way of example, for the input voltage equal 1.89V, E is equal 0.89V. The output of the comparator 24 is high and outputs of the comparators 25 and 26 are low. Thereby, the output code is 100 as outputs of the gates 28 and 29 are 1 and 0 respectively. Consequently, the switch 31 controlled by gate 28 is closed, whereby the multiplexer output voltage is 0.89V.

Figure 3:
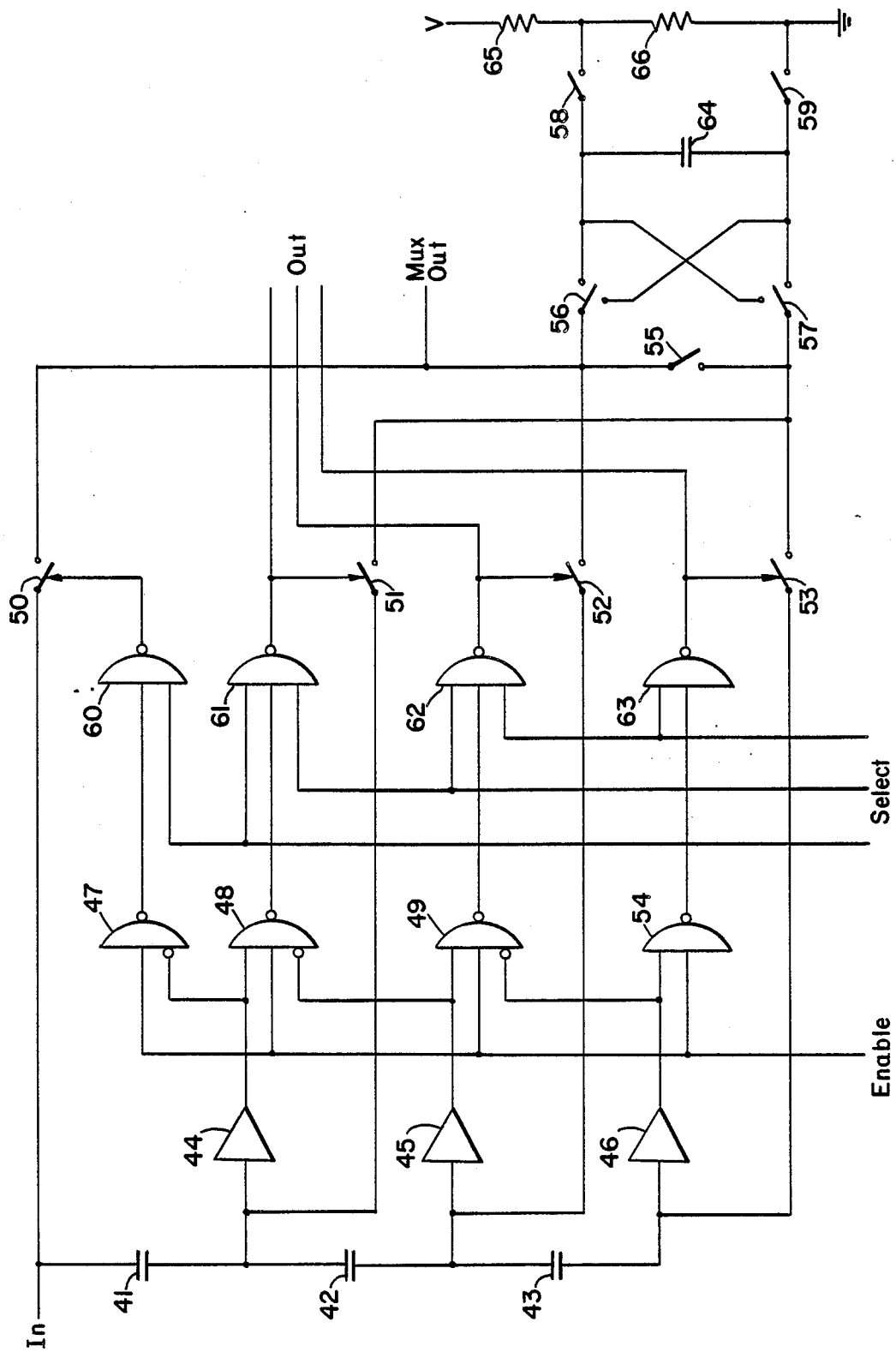
FIG. 3 is an embodiment comprising multiplexer/demultiplexers and capacitor ladder referenced to a variable input signal.

FIG. 3 is an embodiment comprising multiplexer/demultiplexers and capacitor ladder referenced to a variable input signal. In particular, the FIG. 2 embodiment comprises the resistor ladder referenced to the input signal. Accordingly, the FIG. 2 embodiment can be modified in a manner shown in FIG. 3 as to substitute a capacitor ladder for the resistors 21 thru 23 and reference current source 34. Moreover, the values of the capacitors 41 thru 43 constituting the ladder are not essential and reference signals provided thereby have a higher accuracy.

The capacitors 41 thru 43 correspond to the capacitors 11 thru 13 of FIG. 1 and resistors 21 thru 23 of FIG. 2 respectively. The comparators, gates and switches 44 thru 53 correspond to like components 24 thru 33 of FIG. 2 respectively. The components 44 thru 54 and 60 thru 63 also constitute the selective means which corresponds to the demultiplexers 17 and 18 combined with output device 20 of FIG. 1. The switches 55 thru 59 constitute a switch circuit which corresponds to 10 of FIG. 1. The capacitor 64 stores the base signal and corresponds to 14 of FIG. 1.

Specifically, the comparators 44 thru 46 are coupled to the ladder for comparing the respective comparison signals against ground and determining the output code. The comparison signals are also separately applied to the switches 50 thru 53 for selecting one of the signals in response to the output code. The capacitor 64 can be coupled in parallel with any of the capacitors 41 thru 43, one at a time. For that purpose, the selective means includes a pair of multiplexer/demultiplexers each selecting one of the ladder terminals and coupling one of the switch circuit outputs thereto.

The NAND gate 47 has an inverting input coupled to output of the comparator 44. The NAND gates 48 and 49 have noninverting and inverting inputs coupled to outputs of adjacent comparators 44 and 45, 45 and 46 respectively. The NAND gate 54 has a noninverting input coupled to output of the comparator 46. An enable signal is applied to the gates 47 thru 49 and 54. Inputs of the NAND gates 60 thru 63 are coupled to outputs of the gates 47 thru 49 and 54 respectively. Separate select signals are applied to the adjacent gates, i.e. 60 and 61, 61 and 62, 62 and 63. The gates 61 thru 63 also provide the output code.

One multiplexer/demultiplexer comprises the switches 50, 52 and the other switches 51, 53. The selective means operates as a single multiplexer when the enable signal and all three select signals are high. Moreover, the switch 55 is closed and switches 56, 57 open. This configuration can be simplified to that shown in FIG. 2. In particular, one of the comparison signals is selected in response to the output code and applied to the multiplexer output.

The selective means operates as a pair of demultiplexers when the enable signal is low. Thereby, the outputs of the gates 47 thru 49 and 54 are high regardless of the outputs of the comparators 44 thru 46. If the select signal applied to the gates 60 and 61 is low, the switches 50 and 51 are closed, whereby the capacitor 41 is selected and coupled across switch means outputs. Similarly, if the select signal applied to the gates 61 and 62 is low, the switches 51 and 52 are closed, whereby the capacitor 42 is selected. Finally, if the select signal applied to the gates 62 and 63 is low, the switches 52 and 53 are closed, whereby the capacitor 43 is selected. By these means, the base voltage stored in the capacitor 64 can be applied across the selected capacitor by closing the switches 56 and 57.

The voltages stored in the selected capacitor and capacitor 64 are applied to the switch means outputs, one of which is coupled to the multiplexer output. With reference thereto, the voltage across the capacitor 41 or 43 has an opposite polarity than the voltage across the capacitor 42. The switches 56 and 57 can couple terminals of the capacitor 64 to switch means outputs in either order. By these means, the voltages stored in the selected capacitor and capacitor 64 have the same polarity. The values of the capacitors 41 thru 42 are significantly smaller than of the capacitor 64, whereby the base voltage stored therein remains virtually unchanged.

The switch means comprises the switches 58, 59 and 56, 57 for alternatively coupling the capacitor 64 to a source means or the switch means outputs respectively. The source means includes a reference source providing the voltage V and pair of the resistors 65 and 66 for dividing the voltage V. The voltage provided by the resistor pair is equal V/3, whereby the base voltage across the capacitor 64 is substantially equal V/3. The voltage V may be controllable as to vary the base voltage stored in the capacitor 64 and thereby obtain unequal voltages across of the capacitors 41, 42 and/or 43. The switch 55 is coupled across the switch means outputs and is open or closed when the selective means operates as the single multiplexer or pair of demultiplexers respectively.

The operation of the apparatus will become more clear by analyzing an example of the ladder providing four reference voltages equal 0V, −1V, −2V and −3V, similarly to the previous numeric example. The selective means operates as the single multiplexer when the enable signal and all three select signals are high. Moreover, the switch 55 shorts out the switch means outputs. One of the switches 50 thru 53 is closed, whereby the respective comparison signal is selected and applied to the multiplexer output. The switches 56 and 57 are open. The voltage across the resistor 66 is equal 1V. The switches 58, 59 are closed, whereby the capacitor 64 is charged to 1V.

The selective means operates as the pair of demultiplexers when the enable signal is low. The capacitor 64 is coupled across the switch means outputs when the switches 56, 57 and 55, 58, 59 are closed and open respectively. The capacitor 64 is further coupled across the capacitors 41 or 43 when the select signal applied to the gates respectively 60, 61 or 62, 63 is low. The voltage appearing across the switch means outputs is equal −1V, with reference to the multiplexer output. The capacitor 64 is coupled across 42 when the select signal applied to the gates 61 and 62 is low. However, the voltage across the switch means outputs is +1V, with reference to the multiplexer output, as the switches 56 and 57 couple the terminals of the capacitor 64 in the reverse order. Thereby, each of the capacitors 41 thru 43 is charged to 1V as to provide the required reference voltages.

Figure 4:
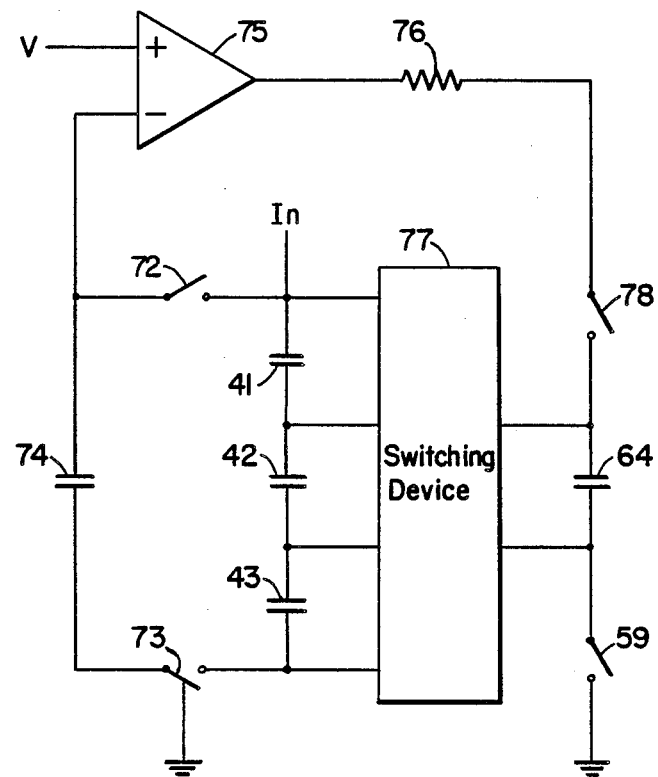
FIG. 4 is an embodiment comprising capacitor ladder referenced to a variable input signal, and a means for sampling voltage across the ladder.

FIG. 4 is an embodiment comprising capacitor ladder referenced to a variable input signal, and a means for sampling voltage across the ladder. The ladder is coupled to the input signal and comprises a plurality of capacitors for providing the reference and comparison signals. Three capacitors 41 thru 43 coupled in series are shown for simplicity. A source means charges the capacitor 64 and thereby determines a base voltage stored therein. The switching device 77 successively couples the terminals of each capacitor 41 thru 43 across the capacitor 64. The source means includes the comparator 75 which compares the voltage V against a voltage appearing across the capacitor ladder. The source means further includes a sampling means for sampling this voltage and storing it in the capacitor 74. The switches 72 and 73 couple the capacitor 74 across the ladder. Otherwise, the switch 73 couples the capacitor 74 to ground.

The comparator 75 and resistor 76, coupled in series therewith, correspond to 15 and 16 of FIG. 1 respectively. The switching circuit 77 may include the components 44 thru 57 and 60 thru 63 as shown in FIG. 3. Therefore, the capacitors 41 thru 43 and 64, and switch 59 have the same reference numbers as in FIG. 3. Moreover, the resistors 65 and 66 shown therein are replaced by the source means including the comparator 75 and resistor 76. The switch 78 is coupled in series therewith and corresponds to the switch 58 of FIG. 3.

The switching device 77 successively couples both terminals of each capacitor 41 thru 43 across the capacitor 64. The switches 59 and 78 are open and the switches 72 and 73 couple the capacitor 74 to the capacitors 41 and 43, i.e. across the ladder. By these means, the capacitors 41 thru 43 are successively coupled in parallel with the capacitor 64 while the capacitor 74 senses the voltage appearing across the ladder. Subsequently, the switching device 77 disconnects the capacitor 64 and switches 72, 73, 78 and 59 are switched. The capacitors 74 and 64 are now coupled to ground and further to the inverting input and output of the comparator 75 respectively.

The comparator 75 compares the voltage V against the voltage appearing across the capacitor ladder. The latter voltage is now stored in the capacitor 74 and applied to the inverting input of the comparator 75. The output of the comparator 75 is low or high when the voltage across the capacitor 74 is greater or smaller than V respectively. As a result, the base voltage across the capacitor 64 is adjusted to V/3 so that the sum of the voltages across the capacitors 41 thru 43 is equal V. Obviously, the capacitors 41 thru 43 are each charged to V/3. The accuracy of the reference voltages is very high since the sum of the voltages across the capacitors 41 thru 43 is determined by separately setting the voltages stored therein.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:

1. Reference apparatus for providing reference signals, comprising:
   an input capacitive means for storing a base signal;
   a source means for charging the input capacitive means;
   a switch means having outputs, for coupling the input capacitive means to these outputs or to the source means;
   an output capacitive means having a plurality of terminals for providing the reference signals; and
   a selective means for selecting at least a pair of the output capacitive means terminals and coupling the switch means outputs thereto.

2. Apparatus of claim 1 wherein the source means includes:
   a reference means for providing an additional reference signal; and
   a comparator means for comparing the additional reference signal against a signal appearing between a pair of the output capacitive means terminals.

3. Apparatus of claim 2 wherein the source means further includes a sampling means for sampling the signal appearing between the pair of the output capacitive means terminals.

4. Apparatus of claim 3 wherein the sampling means includes:
   a second capacitive means for storing the signal appearing between the pair of the output capacitive means terminals; and
   a second switch means for coupling the second capacitive means to the pair of the output capacitive means terminals.

5. Apparatus of claim 2 wherein the comparator means includes a resistive means coupled in series therewith for reducing a current charging the input capacitive means.

6. Apparatus of claim 1 wherein the source means includes a resistive divider.

7. Apparatus of claim 1 wherein the switch means includes:
   a pair of input switch means for coupling the input capacitive means to the source means; and
   a pair of output switch means for coupling the input capacitive means to the switch means outputs.

8. Apparatus of claim 1 wherein the output capacitive means includes a plurality of capacitors coupled in series, and
   further wherein each capacitor is coupled to a pair of the terminals.

9. Apparatus of claim 1 wherein the selective means includes demultiplexer means each for selecting one of the output capacitive means terminals and for coupling one of the switch means outputs thereto.

10. Apparatus of claim 1 wherein the selective means includes multiplexer/demultiplexer means each for selecting one of the output capacitive means terminals and for coupling one of the switch means outputs thereto.

11. Apparatus of claim 10 wherein the switch means includes a second switch means for coupling the switch means outputs.

* * * * *